(12) United States Patent
Mödinger

(10) Patent No.: US 7,275,315 B2
(45) Date of Patent: Oct. 2, 2007

(54) METHOD FOR REPAIR SOLDERING OF MULTI-POLE MINIATURE PLUG CONNECTORS

(75) Inventor: Roland Mödinger, Weinstadt (DE)

(73) Assignee: ERNI Electronics GmbH, Adelberg (DE)

( * ) Notice: Subject to any disclaimer, the term of this patent is extended or adjusted under 35 U.S.C. 154(b) by 8 days.

(21) Appl. No.: 11/389,198

(22) Filed: Mar. 24, 2006

(65) Prior Publication Data
US 2006/0216972 A1    Sep. 28, 2006

(30) Foreign Application Priority Data
Mar. 24, 2005 (DE) ............... 10 2005 013 599

(51) Int. Cl.
*H05K 3/00* (2006.01)
(52) U.S. Cl. ............... 29/843; 29/402.09; 29/402.16; 29/832
(58) Field of Classification Search ............ 29/402.09, 29/402.16, 741, 832, 840, 843
See application file for complete search history.

(56) References Cited

U.S. PATENT DOCUMENTS

| | | | | |
|---|---|---|---|---|
| 4,767,344 A | * | 8/1988 | Noschese | 439/83 |
| 5,730,932 A | * | 3/1998 | Sarkhel et al. | 420/562 |
| 5,743,009 A | * | 4/1998 | Matsui et al. | 29/843 |
| 5,875,546 A | * | 3/1999 | Cachina et al. | 29/843 |
| 6,099,365 A | * | 8/2000 | Cachina et al. | 439/876 |
| 6,179,631 B1 | * | 1/2001 | Downes et al. | 439/83 |
| 6,183,301 B1 | | 2/2001 | Paagman | |
| 6,471,549 B1 | | 10/2002 | Lappöhn | |
| 6,494,754 B2 | * | 12/2002 | Cachina et al. | 439/876 |

FOREIGN PATENT DOCUMENTS

| | | |
|---|---|---|
| DE | 100 51 819 | 4/2001 |
| DE | 101 31 225 | 2/2002 |
| DE | 102 29 953 | 1/2004 |
| EP | 1 494 515 | 1/2005 |

* cited by examiner

*Primary Examiner*—Carl J. Arbes
(74) *Attorney, Agent, or Firm*—Collard & Roe, P.C.

(57) ABSTRACT

A method for repair soldering of multi-pole miniature plug connectors on printed circuit boards, having signal contact pins in the SMT design and shroud pins in the THR design. The plug connectors have shrouds whose shroud pins project out on the back of the printed circuit board. Preforms are glued onto the SMD signal contact pins, and the repair plug connectors are set into THR holes of the board with their shroud pins. The signal contact pins are soldered using SMT technology. Subsequently, the shroud pins are soldered from the back of the board. The solder connects with the solder eyes of the solder holes on the back of the board, as well as flows into the ring gap between the metallized inside walls of the solder holes and the shroud pins in the circuit board, and produces a material-lock connection. Finally, the shroud pins that project out are shortened.

5 Claims, 3 Drawing Sheets

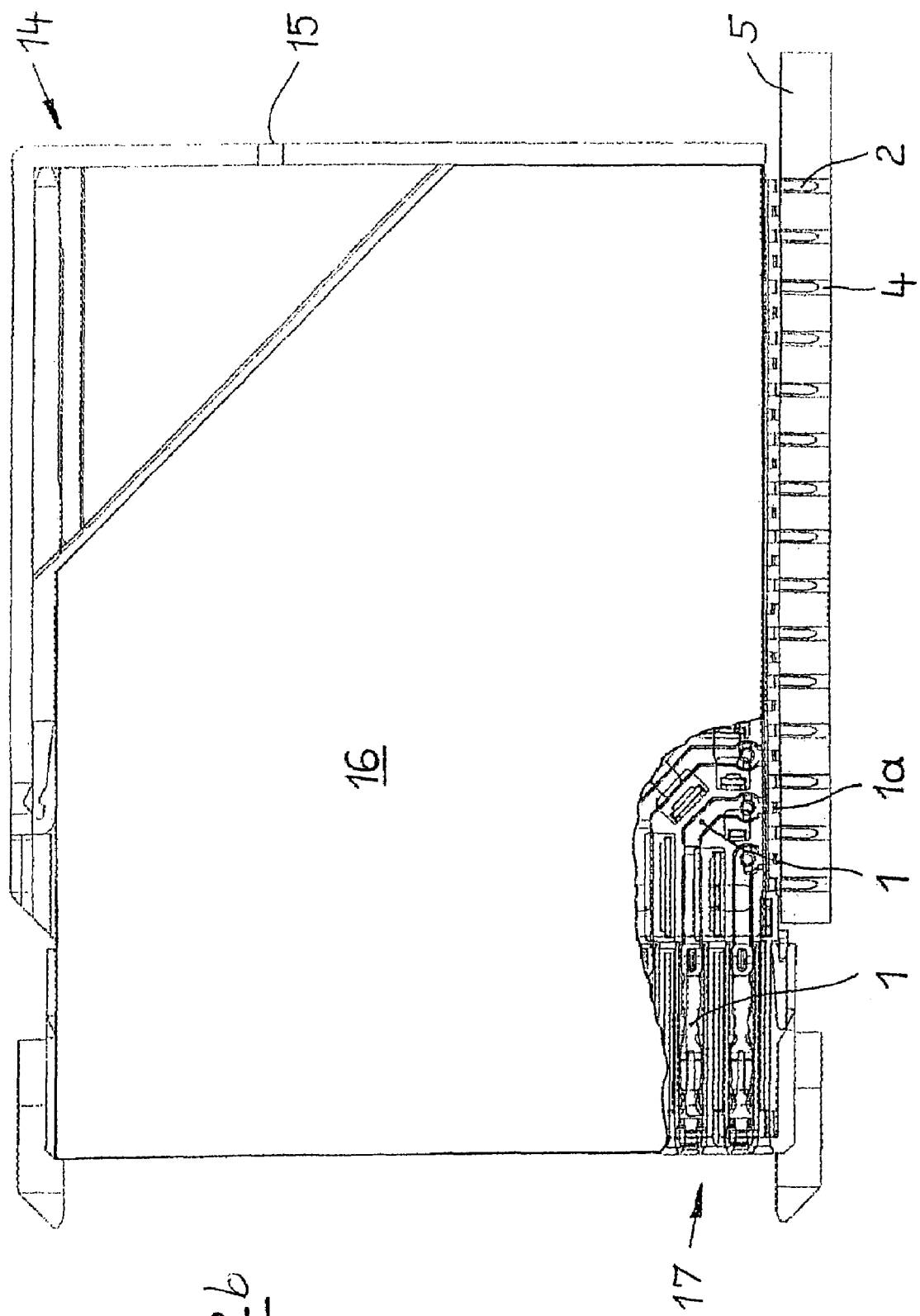

METHOD FOR REPAIR SOLDERING OF MULTI-POLE MINIATURE PLUG CONNECTORS

BACKGROUND OF THE INVENTION

1. Field of the Invention

The invention relates to a method for repair soldering of multi-pole miniature plug connectors on printed circuit boards, having signal contact pins in the SMT design and shroud pins in the THR design.

2. The Prior Art

Female multi-point connectors, as an example of multi-pole miniature plug connectors having signal contact pins in the SMT design and shroud pins in the THR design, consist essentially of a greater number of signal conductor tracks that are embedded in plastic chambers of contact disks, which carry shrouds on the outside, to improve the high-frequency properties of the female multi-point connectors (see, for example, German Patent No. DE 100 51 819 A1). The conductor tracks of the signal contacts are configured, at one end, as lyre-shaped spring contacts for blade-like counter-contacts, guided in their chambers in 90° arcs, and are provided with solder pins for being soldered to a circuit board at the other end. Several contact disks in turn are pushed into a plastic quiver, parallel to one another, and thereby joined together as a compact body. The shrouds also carry solder pins, which proceed in a comb-tooth-like manner from a sheet-metal edge of the shrouds, and are also soldered to the printed circuit board.

Female multi-point connectors are particularly used for connections between a printed circuit board of a module and a rear wall printed circuit board equipped with male multi-point connectors. Usually, the solder pins consist of base metal, such as a copper alloy, corresponding to the material of the signal conductor tracks, and are very small in their dimensions. For example, they have a width of 0.35 mm. The diameters of the metallized solder holes in the printed circuit boards are correspondingly small. The distances between the solder pins, or the solder holes, respectively, relative to one another are very close. They possess a grid dimension of 2.0 mm, for example. Therefore, only very small amounts of solder are allowed to be used when soldering the solder pins onto a printed circuit board. On the other hand, the mechanical connection and the electric current carrying capacity suffer if the solder contact between the solder pins and the solder holes is too slight, resulting in functional failures and shortening of the useful lifetime.

Often, the signal contact pins are configured as SMD pins (Surface Mounted Device) for surface mounting (SMT, Surface Mounting Technology), while the shield pins are contacted through according to the Through Hole Reflow (THR) technology.

In the SMT technology, solder paste deposits are applied to a printed circuit board by means of stencil or screen printing, in the grid dimensions of the solder pins. For soldering, the SMD pins are pressed onto a solder paste deposit with their little feet, in each instance. The melting process itself then takes place by means of temperature effect in a solder oven, whereby the SMD pins are mechanically and electrically connected with the solder paste deposits. A prerequisite for a good connection is that all of the solder pins rest against solder paste deposits that are applied to be as level, uniform, and precise in their position as possible, on a printed circuit board that is also as level as possible, at the slight pressure that is necessary for SMT soldering, and with as much of their area as possible. On the other hand, it is a benefit of SMT technology that no holes have to be made in the printed circuit board, and that the tolerance width with regard to the deviations in position of the solder pins relative to one another does not have to be kept extremely small transverse to the set-down direction of the components.

In the case of contacting according to the TH technology (Through-Hole Technology), the solder pins are inserted through small holes in the printed circuit board. A metal layer on the underside of the printed circuit board, the solder eye, forms the solder side. During the actual soldering process, the printed circuit board is drawn downward over a wave of liquid solder, in the wave soldering method. Since the holes are hardly any larger than the diameter of the pins, the TH technology demands a rather precise alignment of the solder pins. Otherwise, it can happen that not all of the solder pins find their solder hole, thereby causing functional problems of the module.

In the case of the so-called THR technology (Through-Hole-Reflow Technology) that links the two aforementioned technologies, also known in the technical world as "Pin-in-Paste Method," the printed circuit boards are provided with metallically through-contacted bores, whereby analogous to the SMT technology, solder paste deposits are applied to the bores, which are through-contacted here. During component application, the needle-like solder pins of the component to be mounted, for example the shroud pins of a female multi-point connector, push the solder paste of the solder paste deposits at least partially through the bore hole, without great press-in pressure, so that during the subsequent reflow soldering, soldering of the solder pin, in each instance, within the through-contacted bore takes place. The solder, which is liquid at working temperature, flows into the ring gap between the solder hole and the solder pin, supported by capillary forces. By means of the solder paste that melts in the through-contacted bore and at the top of the contact pin, a similar solder point as that known from traditional wave soldering is obtained. The mechanical ability to withstand stress that is required for plug connectors, with regard to plug-in forces, remains guaranteed. A great advantage of the THR technology can be seen in that it can easily be integrated into the SMT production process, in other words only an application method for applying the solder paste deposits has to be used, and soldering itself can take place in one and the same heating pass, e.g. in a soldering oven. As compared with the SMT technology, the THR technology furthermore has the advantage that aside from a comparatively firm mechanical seat on the printed circuit board, there is also comparatively good electrical stress resistance. The solder pin length should be coordinated with the thickness of the printed circuit board, as much as possible, in order to be able to assess the final quality of the solder point, on the basis of the formation of the solder cones and their circumference wetting.

The repair of equipped printed circuit boards regularly presents problems. If, for example, the lyre contact of a contact spring of the female multi-point connector bends or breaks off in subsequent use, the female multi-point connector must be unsoldered by hand, the printed circuit board has to be cleaned of solder residues and any flux agent residues, as well as dirt, and a new female multi-point connector must be soldered in by hand. Currently, one makes do in connection with adding new equipment in that the necessary solder paste deposits for the SMD or THR pins are placed in the grid dimensions while being viewed through a magnifying glass, by means of a stencil and doctor, or by hand. However, due to the extraordinary fineness of the solder connections of a female multi-point connector and the small distances between solder pins, this is extremely difficult and time-consuming, since it is necessary to adhere to required tolerances and to avoid smearing of the solder paste on the printed circuit board when lifting off the application stencil. In this connection, it must also be seen that the printed circuit board is already equipped with numerous other components, which make the repair work even more difficult.

SUMMARY OF THE INVENTION

Proceeding from these known inadequacies, it is an object of the invention to develop a method that significantly facilitates repair work with regard to the replacement of miniaturized electrical plug connectors having SMD and THR solder pins.

This task is accomplished, according to the invention, by a method for repair soldering of multi-pole miniature plug connectors on printed circuit boards, having signal contact pins in the SMT design and shroud pins in the THR design, wherein the repair plug connectors are provided with shrouds whose shroud pins clearly project out on the back of the printed circuit board, beyond its thickness. Preforms are glued onto the SMD signal contact pins. Subsequently, the repair plug connectors prepared in this manner are set into THR holes of the printed circuit board with their shroud pins. Afterwards, the signal contact pins are soldered using SMT technology. Subsequently, the shroud pins are soldered from the back of the printed circuit board, using a manual soldering device. The solder connects with the solder eyes of the solder holes on the back of the printed circuit board, as well as flows into the ring gap between the metallized (through-contacted) inside wall of the solder holes and the shroud pins, in the printed circuit board, and produces a material-lock connection. Finally, the shroud pins that project out are shortened.

With the invention, repair work that consists of replacing miniature plug connectors that have become unusable with functioning plug connectors is made significantly easier.

The invention and its advantages will be explained in greater detail below, using an exemplary embodiment on the basis of a female multi-point connector.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views:

FIG. 2b shows the complete view of a connector having the detail from FIG. 2a.

DETAILED DESCRIPTION OF THE PREFERRED EMBODIMENT

Figure 1:
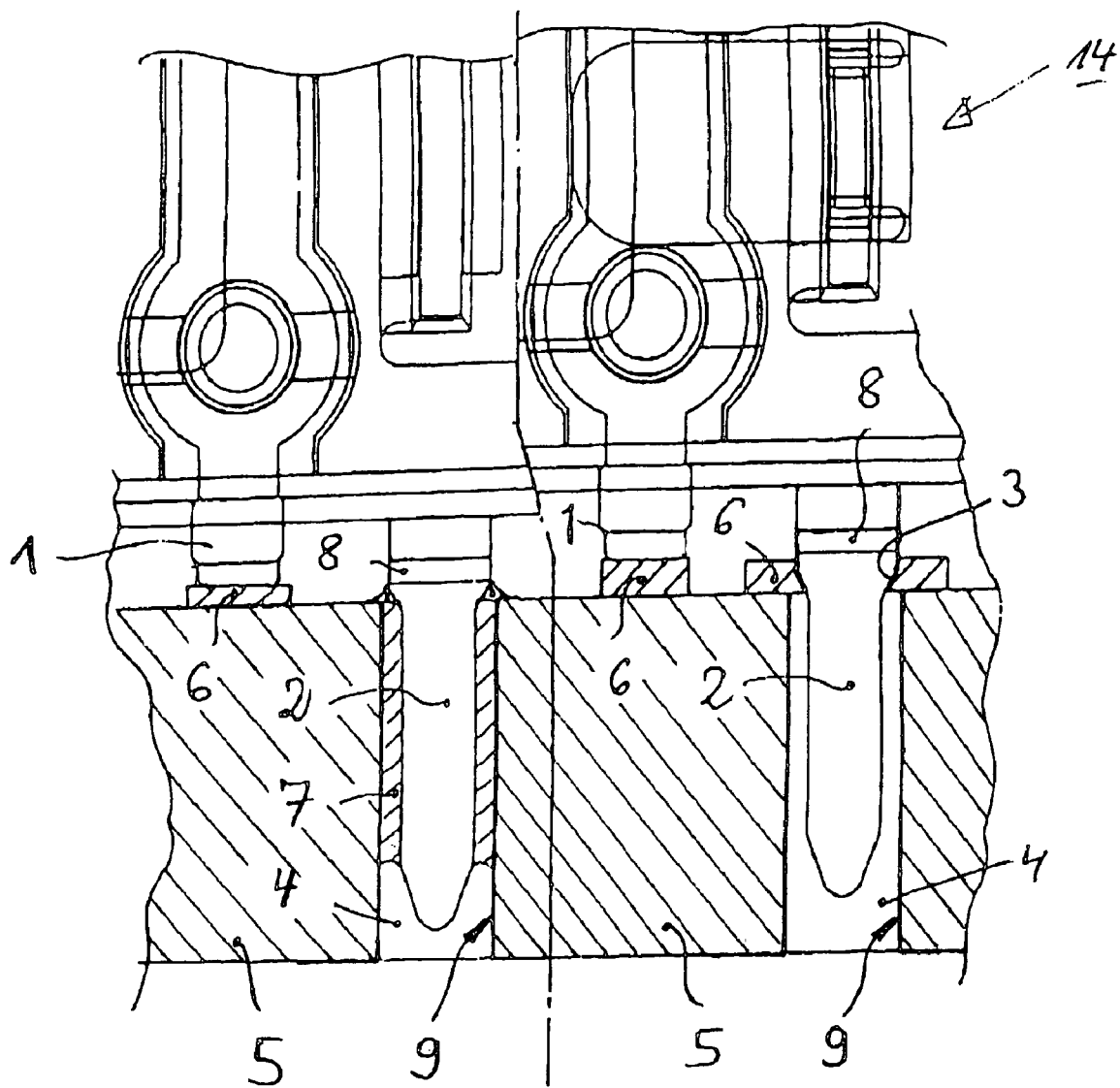
FIG. 1 shows a greatly magnified detail of a contact disk of a female multi-point connector in the solder region of a printed circuit board according to the state of the art.
Figure 2A:
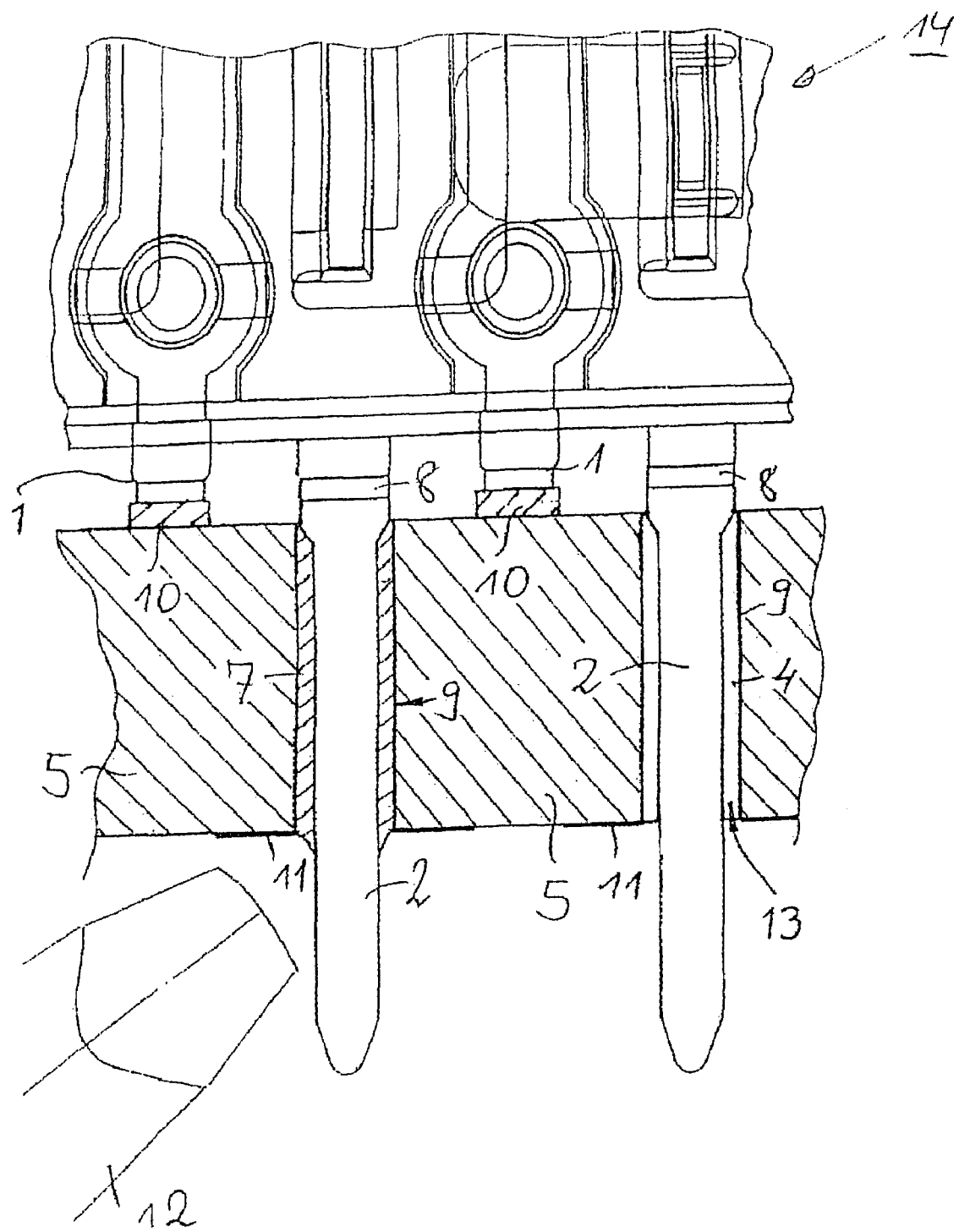
FIG. 2a shows the same detail according to the present invention, whereby the same reference symbols are used.

Referring now in detail to the drawings, as shown in FIGS. 1, 2a and 2b, a contact disk of a multi-pole female multi-point connector 14 carries signal contact pins 1 of signal conductor tracks in slots of a temperature-resistant insulation material plate 15, at pin intervals of 2.0 mm, which pins are structured in the SMT design 1a at the solder end. For this purpose, the signal contact pins 1 are bent at a right angle to form little feet, at their free end. Another plate 16 of insulation material secures the signal conductor tracks. Between these two insulation material plates, the signal conductor tracks run to the other end 17, disposed closely next to one another and describing a 90° arc, at which end lyre-shaped springs, not shown in greater detail, are formed on for connection with a counter-piece.

The signal conductor tracks are electromagnetically shielded by means of shrouds disposed parallel to the insulation material chamber, the shroud pins 2 of which also lie at a pin distance of 2.0 mm, but all on the same potential (ground), and are structured in the THR design. This combination allows the use of the HF technology advantages of the SMT connectors, on the one hand, in that data rates of 10 Gbit/s and more are supported. On the other hand, the reflow-soldered shroud pins 2 assure robust plugging with strain relief. Furthermore, the shroud pins 2 offer great mechanical stability. The width of the signal contact pins 1 as well as that of the shroud pins 2 is 0.35 mm, for example, while the sheet-metal thickness is approximately 0.2 mm.

The shrouds have the dimensions of a rectangular contact disk for a female multi-point connector strip, whereby the insertion corner for insertion into a corresponding chamber slot of a female multi-point connector chamber is cut free. The shrouds are produced using punch cutting, from a thin copper sheet. Bent-out claws serve for outside attachment in corresponding slots of a plastic plate, not shown, which is joined together with a second plastic plate, also not shown. All of the pins of a female multi-point connector, both the signal contact pins 1 and the shroud pins 2, therefore stand very close and in several rows next to one another.

The solder pins, the signal contact pins 1 and the shroud pins 2, are usually provided with a thin tin film of 4-6 µm at their ends, using the immersion method, in order to improve the contacting. However, they can also be coated with a precious metal.

The first soldering of female multi-point connector 14 with signal contact pins 1 in the SMT design and shroud pins 2 in the THR design, in a normal production process, will be illustrated using FIG. 1.

The insertion depth of the THR solder pins 2 is limited by a shoulder-like broadened region 3 of the shroud pins 2 (THR solder pins), above the through-contacted solder holes 4 in a printed circuit board 5, in that the shoulders 3 of the THR solder pin 2 have a greater width than the diameter of the through-contacted solder hole 4. Also, the little feet of the signal contact pins 1 in the SMT design limit the insertion depth. The broadened region 3 of the THR solder pins 2 makes a transition into the shroud. The THR solder pins 2 project over by about 1.0 to 1.5 mm on the opposite side of a thin printed circuit board 5, in order to be able to assess the quality of a solder point by means of visual inspection, in accordance with the standard IPC-A-6110C; in the case of a somewhat thicker printed circuit board, as FIG. 1 shows, this is not the case.

Soldering of the THR solder pins 2 takes place using the THR method outlined at the beginning. This means that a solder paste deposit 6 applied by machine, using screen printing or stencil printing, and using precision technology, is partially entrained into the through-contacted solder holes 4 during insertion of the THR solder pins 2, which can also take place by machine, whereby the solder 7 assures a sufficient connection, within the solder hole 4, between the metallized inside wall 8 of the solder hole 4 and the THR solder pin 2, during the reflow process. A solder barrier 8 above the shoulder 3 supplementally ensures that the solder 7 remains captive in the solder hole 4 and does not wet the shroud. Preferably, soldering is performed with lead-free solder. The flux agent mixed into the solder paste already begins to run in the heat-up phase of the printed circuit board 5, and the solder 7 melts afterwards. The solder 7 migrates along the shroud pin 2 into the through-contacted solder hole 4, whereby the melted solder 7 penetrates into the gap between shroud pin 2 and the metallized solder hole inside wall 9 of the solder hole 4. Furthermore, the solder 7 that was mechanically entrained by the shroud pin 2 during penetration of the solder paste deposit 6 and has also melted at the tip of the shroud pin 2 distributes itself in the ring gap.

In FIG. 1, two solder pins 2 in the SMT design can furthermore be seen, namely the signal contact pins 1. Their solder paste deposits 6 have been applied together with the solder paste deposits 6 for the shroud pins 2, using screen printing or stencil printing. The signal contact pins 1 are soldered at the same time with the shroud pins 2 and preferably in a soldering oven.

The unsoldered state is shown in the right half of FIG. 1, the soldered state is shown in the left half of FIG. 1.

If it becomes necessary to replace a female multi-point connector, the repair takes place by hand. After the old female multi-point connector has been unsoldered, all of the solder points must first be cleaned thoroughly. For this purpose, all the old residues of solder and flux agent must be removed. Furthermore, the printed circuit board 5 must be freed of dirt, grease, and moisture.

However, soldering in a usual female multi-point connector encounters significant difficulties even then. For one thing, the placement of new solder paste deposits 6 with the required uniformity and precision is complicated. Even if special manual stencils are used for this purpose, in order to position solder paste on the solder points for the signal contact pins 1 and shroud pins 2 using a doctor, spatula, or similar aid, clean and tolerance-appropriate work is difficult, because of the small dimensions of the solder hole and solder pin distances relative to one another.

Here the invention provides a remedy. The signal contact pins 1 are soldered using SMT technology, during repair soldering, using a small ancillary device in place of a soldering oven. For this purpose, preforms 10, which are industrially pre-punched small solder plates having a firm consistency, are glued onto the little feet of the signal contact pins 1, using a solder tincture, for example using a pair of tweezers or a stencil, thereby placing the solder precisely where it is supposed to solder. Since the preforms 10 can be produced by machine, they are extremely precisely uniform and clean, which means that individual solder thickness values, frayed regions, smears, etc., which would occur when applying solder paste manually, do not have to be feared. The preforms 10 are therefore glued onto the little feet of the signal contact pins 1, and subsequently the female multi-point connector is set onto the printed circuit board and soldered using SMT technology.

Small preform plates are not suitable for repair soldering of the shroud pins 2, since not enough solder will run into the ring gap between the shroud pin 2 and the metallized inside wall 9 of a solder hole 4. If, on the other hand, an attempt is made to solder the shroud pins 2 in with a conventional manual soldering device, from the back of a thicker printed circuit board 5, through which the solder pins 2 do not show, it is not possible to produce a mechanically and electrically secure solder connection, because the solder does not flow all the way to the shroud pin 2, or actually into the ring gap between the metallized inside wall 9 of the solder hole 4 and the shroud pin 2, or does not flow sufficiently, because of its rather great surface tension and the adhesion forces, to produce a correspondingly secure connection.

Until now, no method step has become known that promises sufficient solder success for the shroud pins 2 if a repair is needed.

According to the invention, the procedure followed to overcome the aforementioned difficulties is that special repair plugs are used for soldering miniature plug connectors having SMD and THR pins. The plugs are provided with shrouds whose THR pins 2 project out on the back of the printed circuit board 5 by at least several millimeters, no matter how thick the printed circuit board 5 is. Preforms 10 of a suitable shape and size are glued onto the SMD pins 1, that the repair plug prepared in this manner is set onto the printed circuit board 5 and soldering of the SMD pins 1 using SMT technology takes place first. Subsequently, the THR pins 2 projecting out on the back of the printed circuit board 5 are soldered to the solder eyes 11 of the back of the printed circuit board 5, using a conventional manual soldering device. Sufficient solder 7 also penetrates into the ring gap between the metallized inside walls of the solder holes 4 and the shroud pins 2, by means of capillary action. Finally, the shroud pins 2 that project out on the printed circuit board 5 are shortened.

In FIG. 2a, the detail of a female multi-point connector and a circuit board 5 can be seen, with the entire connector shown in FIG. 2b. The female multi-point connector has been soldered to the printed circuit board 5 using preforms 10 that were previously glued onto the little feet of the SMD signal contact pins 1. The extended shroud pins 2 first look through the through-contacted holes 4 of the printed circuit board 5, without being soldered (right half of FIG. 2a). In this connection, the shroud pins 2 project so far that they can be soldered using a fine manual soldering device 12 (left half of FIG. 2a) and fine solder wire. The solder connects with the solder eye 11 and the shroud pin 2, forming a material lock, and penetrates into the ring gap 13 between the shroud pin 2 and the metallized inside wall 9 of the solder hole 4, because of the intensive heating of the shroud pin by the soldering device, in full length, and also connects these with one another with a material lock. In this way, mechanical and electrical security that is comparable to THR soldering is achieved. Last, the projecting ends of the shroud pins 2 are shortened.

According to one variant, ring-like preforms are pushed onto the shroud pins 2 on the equipment side of the printed circuit board 5, in addition to the preforms 10 for the SMD contacts, which former preforms flow into the ring gap 13 between the metallized inside walls 9 of the solder holes 4 and the shroud pins 2, at least over a partial length, during oven soldering.

The repair soldering method described is not limited to the replacement of miniature plug connectors, but can be used anywhere where a plurality of SMD and THR solder pins that lie close to one another in a miniature version must be soldered, in many different variations, modified according to the invention.

Accordingly, while only a few embodiments of the present invention have been shown and described, it is obvious that many changes and modifications may be made thereunto without departing from the spirit and scope of the invention.

REFERENCE SYMBOLS 1 signal contact pins (SMT design)
1a end of item 1
2 shroud pin (THR design)
3 shoulder of a shroud pin 2
4 through-contacted solder hole
5 printed circuit board
6 solder paste deposit
7 solder
8 solder barrier
9 metallized inside wall of a solder hole 4
10 preform
11 solder eye
12 tip of a manual soldering device
13 ring gap (between item 2 and 9)
14 female multi-point connector
15 insulating plate
16 insulating material plate
17 the other end

What is claimed is:

1. A method for repair soldering of multi-pole miniature plug connectors on printed circuit boards, having signal contact pins in an SMT design and shroud pins in a THR design, comprising the following steps:
    providing the plug connectors with shrouds having shroud pins that project out on a back of the printed circuit board, beyond its thickness,
    gluing preforms onto SMD signal contact pins;
    setting the plug connectors into THR holes of the printed circuit board with their shroud pins;
    soldering the signal contact pins using SMT technology;
    soldering the shroud pins from the back of the printed circuit board using a manual soldering device, wherein the solder connect with solder eyes of solder holes on the back of the printed circuit board, as well as flows into a ring gap between a metallized (through-contacted) inside wall of the solder holes and the shroud pins, in the printed circuit board, and produces a material-lock connection; and
    shortening the shroud pins that project out of the circuit board.

2. The method according to claim 1, wherein solder wire is supplied to the manual soldering device.

3. The method according to claim 1, wherein the shroud pins are provided with preforms, which are pushed onto the shroud pins as rings, and wherein the SMD signal contact pins and THR shroud pins are subsequently oven-soldered in addition to manual soldering of the THR shroud pins.

4. The method according to claim 1, wherein the shroud pins possess a wetting barrier against solder above the soldering region.

5. A method for repair soldering of multi-pole miniature plug connectors on printed circuit boards, having signal contact pins in an SMT design and shroud pins in a THR design, comprising the following steps:
    providing the plug connectors with shrouds having shroud pins that project out on a back of the printed circuit board, beyond its thickness,
    providing the shroud pins with preforms;
    gluing preforms onto SMD signal contact pins;
    setting the plug connectors into THR holes of the printed circuit board with their shroud pins;
    oven soldering the signal contact pins;
    over soldering the shroud pins from the back of the printed circuit board, wherein the solder connect with solder eyes of solder holes on the back of the printed circuit board, as well as flows into a ring gap between a metallized (through-contacted) inside wall of the solder holes and the shroud pins, in the printed circuit board, and produces a material-lock connection; and
    shortening the shroud pins that project out of the circuit board.

* * * * *